United States Patent
Cho et al.

(10) Patent No.: US 9,899,392 B2
(45) Date of Patent: Feb. 20, 2018

(54) SILICON PRECURSOR, METHOD OF FORMING A LAYER USING THE SAME, AND METHOD OF FABRICATING SEMICONDUCTOR DEVICE USING THE SAME

(71) Applicants: Samsung Electronics Co., Ltd., Suwon-si (KR); Dow Corning Corporation, Midland, MI (US)

(72) Inventors: JunHyun Cho, Hwaseong-s (KR); Michael David Telgenhoff, Midland, MI (US); Xiaobing Zhou, Midland, MI (US); Kyunghye Jung, Nam-gu (KR); Younjoung Cho, Hwaseong-si (KR)

(73) Assignees: SAMSUNG ELECTRONICS CO., LTD., Suwon-si (KR); DOW CORNING CORPORATION, Midland, MI (US)

( * ) Notice: Subject to any disclaimer, the term of this patent is extended or adjusted under 35 U.S.C. 154(b) by 0 days.

(21) Appl. No.: 15/223,685

(22) Filed: Jul. 29, 2016

(65) Prior Publication Data

US 2016/0336328 A1    Nov. 17, 2016

Related U.S. Application Data

(62) Division of application No. 14/602,671, filed on Jan. 22, 2015, now abandoned.

(30) Foreign Application Priority Data

Apr. 16, 2014 (KR) .................. 10-2014-0045575

(51) Int. Cl.
*H01L 21/20* (2006.01)
*H01L 27/108* (2006.01)
(Continued)

(52) U.S. Cl.
CPC .... *H01L 27/10855* (2013.01); *H01L 21/0217* (2013.01); *H01L 21/0262* (2013.01);
(Continued)

(58) Field of Classification Search
CPC .............. C07K 14/415; C12N 15/8294; H01L 21/02164; H01L 21/0217; H01L 21/02211;
(Continued)

(56) References Cited

U.S. PATENT DOCUMENTS 7,019,159 B2    3/2006    Dussarrat et al.
7,531,679 B2    5/2009    Wang et al.
(Continued)

FOREIGN PATENT DOCUMENTS

JP    2006-096675    4/2006

*Primary Examiner* — Mohammed Shamsuzzaman
(74) *Attorney, Agent, or Firm* — Myers Bigel, P.A.

(57) ABSTRACT

The inventive concepts provide silicon precursors, methods of forming a layer using the same, and methods of fabricating a semiconductor device using the same. The silicon precursor includes a silane group including two or more silicon atoms. The silicon precursor has a high and uniform adsorption property on surfaces of layers (e.g., a silicon layer, an oxide layer, and a nitride layer) that are mainly used when semiconductor devices are fabricated.

13 Claims, 19 Drawing Sheets

(51) Int. Cl.
*H01L 21/02* (2006.01)
*H01L 27/11556* (2017.01)

(52) U.S. Cl.
CPC .. *H01L 21/02164* (2013.01); *H01L 21/02211* (2013.01); *H01L 21/02488* (2013.01); *H01L 21/02532* (2013.01); *H01L 27/10814* (2013.01); *H01L 21/02595* (2013.01); *H01L 27/108* (2013.01); *H01L 27/11556* (2013.01)

(58) Field of Classification Search
CPC ......... H01L 21/02488; H01L 21/02532; H01L 21/02595; H01L 21/0262; H01L 27/108; H01L 27/10814; H01L 27/10855; H01L 27/11556
USPC .................. 438/62, 397, 478, 400; 117/105; 427/255.393, 579
See application file for complete search history.

(56) References Cited

U.S. PATENT DOCUMENTS

| | | | |
|---|---|---|---|
| 7,540,920 B2* | 6/2009 | Singh | C01B 33/04 117/105 |
| 7,579,496 B2 | 8/2009 | Wang et al. | |
| 7,972,663 B2 | 7/2011 | Wang et al. | |
| 8,377,511 B2 | 2/2013 | Dussarrat | |
| 8,802,547 B2* | 8/2014 | Kakimoto | H01L 21/0245 118/724 |
| 9,076,651 B1* | 7/2015 | Ahmed | H01L 21/02301 |
| 9,111,897 B2* | 8/2015 | Jee | H01L 21/36 |
| 2004/0096582 A1 | 5/2004 | Wang et al. | |
| 2004/0194706 A1 | 10/2004 | Wang et al. | |
| 2005/0080285 A1 | 4/2005 | Wang et al. | |
| 2005/0107627 A1 | 5/2005 | Dussarrat et al. | |
| 2005/0227017 A1 | 10/2005 | Senzaki et al. | |
| 2006/0286775 A1* | 12/2006 | Singh | C23C 16/0227 438/478 |
| 2007/0190768 A1 | 8/2007 | Sato et al. | |
| 2009/0209081 A1* | 8/2009 | Matero | C23C 16/401 438/400 |
| 2010/0203243 A1* | 8/2010 | Wang | C23C 16/24 427/255.28 |
| 2010/0221428 A1 | 9/2010 | Dussarrat | |
| 2010/0317177 A1* | 12/2010 | Huang | C30B 25/02 438/478 |
| 2011/0263105 A1* | 10/2011 | Hasebe | C23C 16/0272 438/482 |
| 2011/0312192 A1* | 12/2011 | Murakami | C23C 16/45523 438/787 |
| 2013/0084693 A1 | 4/2013 | Kakimoto et al. | |
| 2013/0109155 A1 | 5/2013 | Okada et al. | |
| 2013/0323435 A1* | 12/2013 | Xiao | C09D 1/00 427/579 |
| 2013/0344248 A1* | 12/2013 | Clark | C23C 16/34 427/255.393 |

* cited by examiner

SILICON PRECURSOR, METHOD OF FORMING A LAYER USING THE SAME, AND METHOD OF FABRICATING SEMICONDUCTOR DEVICE USING THE SAME

CROSS-REFERENCE TO RELATED APPLICATIONS

This application is a divisional of and claims priority from U.S. patent application Ser. No. 14/602,671, filed Jan. 22, 2015, which claims priority under 35 U.S.C. § 119 of Korean Patent Application No. 10-2014-0045575, filed on Apr. 16, 2014, the disclosure of each of which is hereby incorporated herein by reference in its entirety.

BACKGROUND

The inventive concepts relate to silicon precursors, methods of forming a layer using the same, and methods of fabricating a semiconductor device using the same.

As semiconductor devices have been highly integrated, widths and spaces of semiconductor patterns have been reduced. Recently, three-dimensional (3D) semiconductor devices including vertically stacked patterns have been developed to improve an integration degree of semiconductor devices, so aspect ratios of recessed regions (e.g., contact holes or trenches) have been increased in the 3D semiconductor devices. Thus, it may be difficult to uniformly and conformally form a layer in the recessed regions having the high aspect ratio.

SUMMARY

Embodiments of the inventive concepts may provide silicon precursors capable of providing an excellent seed property.

Embodiments of the inventive concepts may also provide methods of forming a layer having an improved step coverage property.

Embodiments of the inventive concepts may also provide methods of fabricating a semiconductor device capable of improving reliability.

In one aspect, a silicon precursor includes a chemical formula of $R^1$—$Si_xH_y$. In the chemical formula of $R^1$—$Si_xH_y$, "x" is an integral number equal to or greater than 2, "y" satisfies an equation y=2x+1, and "$R^1$" includes at least one of an amino group, an alkyl group, a cyclopentadienyl ($C_5H_5$) group, or a halogen.

In some embodiments, the "$R^1$" may be the amino group and has the following chemical formula 1.

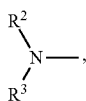

[chemical formula 1]

where each of "$R^2$" and "$R^3$" includes at least one of a methyl group, an ethyl group, a propyl group, an isopropyl group, or a butyl group.

In some embodiments, "$Si_xH_y$" may have a linear structure or a branched structure.

In another aspect, a method of forming a layer may include: providing the silicon precursor of chemical formula of $R^1$—$Si_xH_y$ on a substrate to form a single-layered silicon atomic layer. In the chemical formula of $R^1$—$Si_xH_y$, "x" is an integral number equal to or greater than 2, "y" satisfies an equation y=2x+1, and "$R^1$" includes at least one of an amino group, an alkyl group, a cyclopentadienyl ($C_5H_5$) group, or a halogen.

In some embodiments, the method may further include: forming a silicon nitride layer, a silicon oxide layer, or a silicon-germanium layer on the silicon atomic layer.

In some embodiments, the method may further include: forming a poly-silicon layer on the silicon atomic layer by providing at least one of monosilane ($SiH_4$), disilane ($Si_2H_6$), or a high-grade silane ($Si_nH_{2n+2}$, where "n" is an integral number equal to or greater than 3).

In some embodiments, foaming the poly-silicon layer may further include: doping the poly-silicon layer by providing at least one of Group III elements, Group V elements, or carbon.

In some embodiments, the method may further include: forming a non-silicon atomic layer on the silicon atomic layer. Forming the silicon atomic layer and forming the non-silicon atomic layer may be alternately and repeatedly performed, and the non-silicon atomic layer may be formed by providing a gas including oxygen, nitrogen, or germanium.

In some embodiments, the "$R^1$" may be the amino group and has the following chemical formula 1.

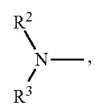

[chemical formula 1]

where each of "$R^2$" and "$R^3$" independently includes at least one of a methyl group, an ethyl group, a propyl group, an isopropyl group, a butyl group, or a tert-butyl group.

In some embodiments, the silicon precursor may be diisopropylaminodisilane ((($CH_3$)$_2$CH)$_2$N—$SiH_2SiH_3$).

In some embodiments, the substrate may include an oxide layer formed thereon, and the silicon precursor may be provided on the oxide layer.

In still another aspect, a method of fabricating a semiconductor device may include: providing the silicon precursor of chemical formula of $R^1$—$Si_xH_y$ on a substrate to form a single-layered silicon atomic layer. In the chemical formula of $R^1$—$Si_xH_y$, "x" is an integral number equal to or greater than 2, "y" satisfies an equation y=2x+1, and "$R^1$" includes at least one of an amino group, an alkyl group, a cyclopentadienyl ($C_5H_5$) group, or a halogen.

In some embodiments, the method may further include: forming a lower structure including a recessed region on the substrate before the formation of the silicon atomic layer. The silicon atomic layer may be formed to conformally cover the lower structure.

In some embodiments, the recessed region may be a contact hole. In this case, forming the lower structure may include: forming an interlayer insulating layer covering the substrate; and patterning the interlayer insulating layer to form the contact hole.

In some embodiments, the method may further include: forming a poly-silicon layer filling the contact hole on the silicon atomic layer by providing at least one of monosilane ($SiH_4$), disilane ($Si_2H_6$), or a high-grade silane ($Si_nH_{2n+2}$, where "n" is an integral number equal to or greater than 3) after the formation of the silicon atomic layer.

In some embodiments, the method may further include: forming a contact plug including a portion of the poly-silicon layer in the contact hole; and forming a data storage element electrically connected to the contact plug. For example, the data storage element may be a capacitor.

In some embodiments, the recessed region may be an active hole. In this case, forming the lower structure may include: alternately and repeatedly stacking sacrificial layers and inter-gate insulating layers on the substrate; and successively patterning the inter-gate insulating layers and the sacrificial layers to form the active hole exposing the substrate.

In some embodiments, the method may further include: forming an active pillar covering a sidewall of the active hole after the formation of the silicon atomic layer, the active pillar having a cup-shape; and replacing the sacrificial layers with a conductive layer.

In some embodiments, forming the active pillar may include: conformally forming a poly-silicon layer on the silicon atomic layer by providing at least one of monosilane ($SiH_4$), disilane ($Si_2H_6$), or a high-grade silane ($Si_nH_{2n+2}$, where "n" is an integral number equal to or greater than 3). The poly-silicon layer may cover the sidewall of the active hole.

In some embodiments, the "$R^1$" may be the amino group and has the following chemical formula 1.

[chemical formula 1]

where each of "$R^2$" and "$R^3$" independently includes at least one of a methyl group, an ethyl group, a propyl group, an isopropyl group, a butyl group, or a tert-butyl group.

In some embodiments, the silicon precursor may be diisopropylaminodisilane ((($CH_3)_2CH)_2N$—$SiH_2SiH_3$).

In some embodiments, the substrate may include an oxide layer formed thereon, and the silicon precursor may be provided on the oxide layer

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1A:
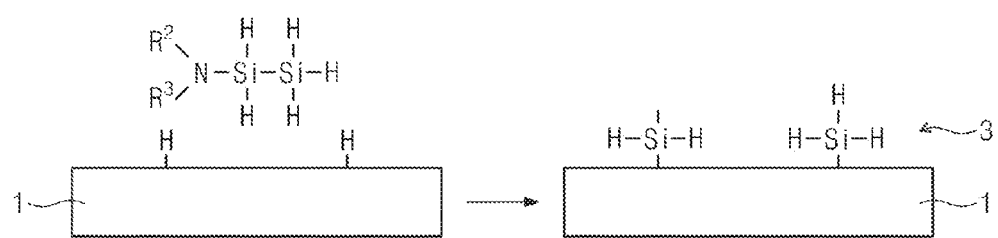
FIGS. 1A and 1B are cross-sectional views illustrating adsorption processes of a silicon precursor according to some embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

A silicon precursor according to the inventive concepts has a chemical formula of $R^1$—$Si_xH_y$, where "x" is an integral number equal to or greater than 2, "y" satisfies an equation $y=2x+1$, and "$R^1$" includes at least one of an amino group, an alkyl group, a cyclopentadienyl ($C_5H_5$) group, or a halogen.

In some embodiments, "$R^1$" may be the amino group and may have a structure expressed by the following chemical formula 1.

[Chemical formula 1]

where each of "$R^2$" and "$R^3$" includes at least one of a methyl group, an ethyl group, a propyl group, an isopropyl group, or a butyl group.

"$Si_xH_y$" may have a linear structure or a branched structure.

Figure 1B:
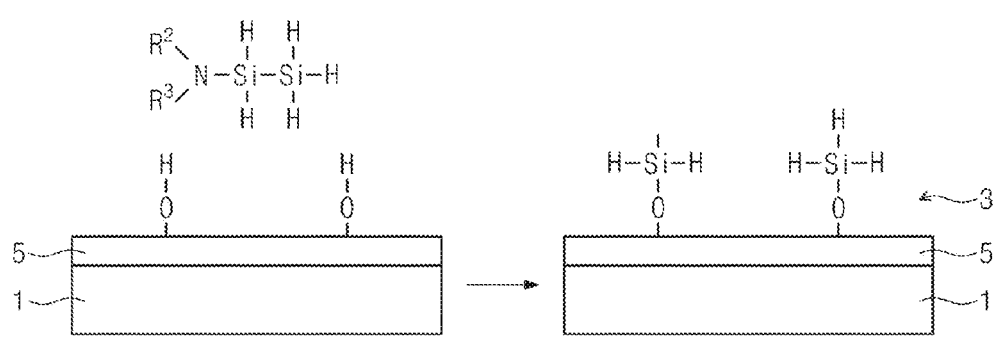

Next, a method of forming a layer using the silicon precursor of the inventive concepts will be described. FIGS. 1A and 1B are cross-sectional views illustrating adsorption processes of a silicon precursor according to some embodiments of the inventive concepts.

Referring to FIG. 1A, a substrate 1 is prepared. The substrate 1 may be, for example, a single-crystalline silicon wafer. Hydrogen may be bonded to a top surface of the substrate 1. For example, amino disilane ($R^1$—$Si_xH_y$, where "x" is 2, "y" is 5, and "$R^1$" is the amino group) is supplied as the silicon precursor. In the event that the amino disilane is supplied to a top surface of the substrate 1, the amino group separates the hydrogen of the substrate 1 from the substrate 1. A disilanyl group of the amino disilane is bonded to a spot from which the hydrogen is separated. At this time, a bond between silicon atoms of the disilanyl group may be easily broken, and then the silicon atoms may be laterally diffused. The diffused silicon atoms may be adsorbed and bonded to the surface of the substrate 1. Thus, two silicon adsorption sites may be formed from one amino disilane. As a result, a single-layered silicon atomic layer 3 may be formed.

Alternatively, as illustrated in FIG. 1B, an oxide layer 5 may be disposed on the substrate 1. Hydroxyl groups (—OH) may be bonded to a top surface of the oxide layer 5. For example, the amino disilane ($R^1$—$Si_xH_y$, where "x" is 2, "y" is 5, and "$R^1$" is the amino group) is supplied as the silicon precursor. In the event that the amino disilane is supplied to a top surface of the substrate 1, the amino group separates hydrogen from the hydroxyl group. The disilanyl group is adsorbed or bonded to a spot (e.g., an oxygen atom) from which the hydrogen is separated. At this time, a bond between silicon atoms of the disilanyl group may be easily broken, and then the silicon atoms may be laterally diffused. The diffused silicon atoms may be adsorbed and bonded to the oxygen atoms of the top surface of the oxide layer 5. Thus, two silicon adsorption sites may be formed from one amino disilane. On the other hand, if monosilane ($SiH_4$) is supplied as a silicon precursor, only one silicon adsorption site may be formed from one silicon precursor. However, the silicon precursor according to the embodiments of the inventive concepts may be supplied to quickly and uniformly the single-layered silicon atomic layer 3.

In the present embodiment, the disilane having two silicon atoms is described as an example. However, the inventive concepts are not limited thereto. If the silicon precursor according to the inventive concepts includes a high-grade silane including three or more silicon atoms, three or more silicon adsorption sites may be formed from one silicon precursor by the same principle as described above.

Hydrogen atoms are bonded to the silicon atom in the silicon atomic layer 3. However, the hydrogen atoms bonded to the silicon atom may be removed during a subsequent process of forming a silicon-containing layer (e.g., a polysilicon layer, a silicon nitride layer, a silicon oxide layer, or a silicon-germanium layer). In addition, elements constituting the silicon-containing layer may be bonded to the silicon atom from which the hydrogen atoms are removed.

Figure 2A:
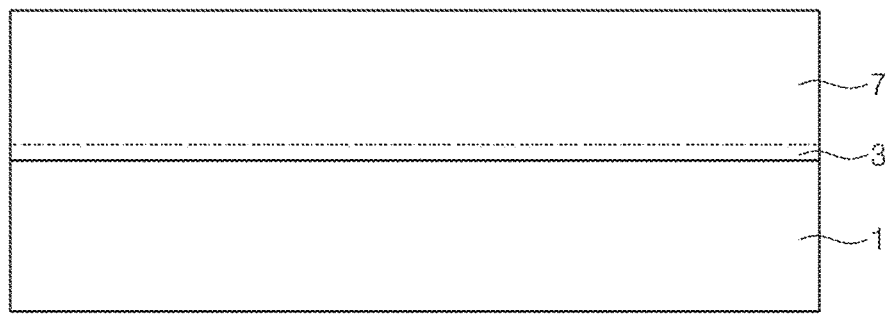
FIGS. 2A, 2B, and 2C are cross-sectional views illustrating methods of forming a layer according to some embodiments of the inventive concepts.
Figure 2B:
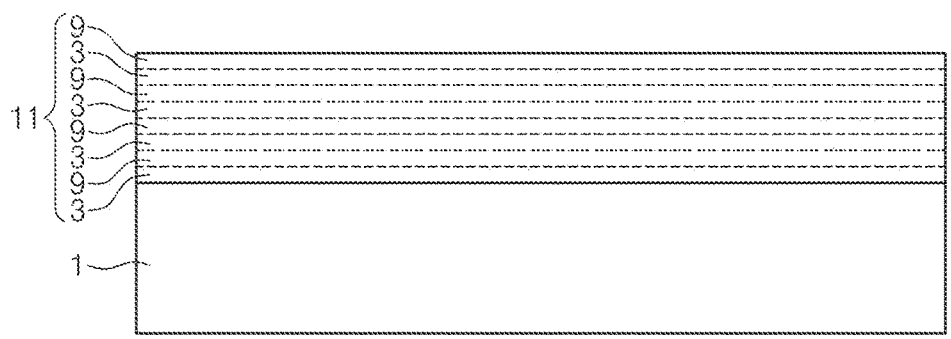
Figure 2C:
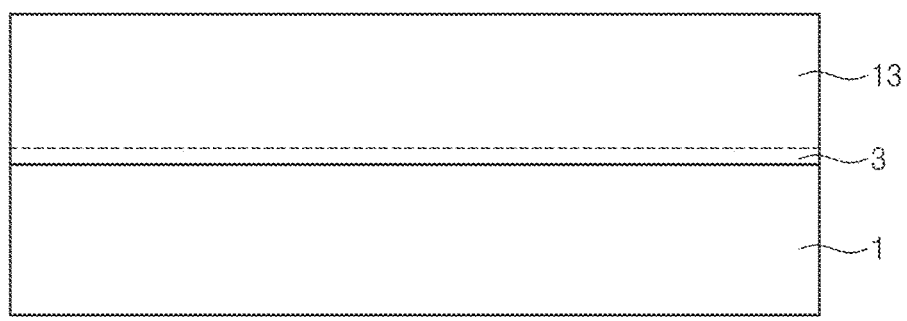

A method of forming a layer using the silicon precursor of the inventive concepts will be described hereinafter. FIGS. 2A, 2B, and 2C are cross-sectional views illustrating methods of forming a layer according to some embodiments of the inventive concepts.

Referring to FIG. 2A, a silicon atomic layer 3 is formed on a substrate 1, as described with reference to FIG. 1A. Even though not illustrated in FIG. 2A, the oxide layer 5 may be additionally formed on the substrate 1, as described with reference to FIG. 1B. A poly-silicon layer 7 is formed on the silicon atomic layer 3. The silicon atomic layer 3 may act as a seed layer for the formation of the poly-silicon layer 7. In the present embodiment, a silicon precursor supplied for the formation of the silicon atomic layer 3 may be defined as a first silicon precursor, and a silicon precursor supplied for the formation of the poly-silicon layer 7 may be defined as a second silicon precursor. All kinds of silanes may be used as the second silicon precursor regardless of the number of a silicon atom in the silane. In other embodiments, the second silicon precursor may include at least one of monosilane ($SiH_4$), disilane ($Si_2H_6$), or a high-grade silane ($Si_nH_{2n+2}$, where "n" is an integral number equal to or greater than 3). The second silicon precursor is supplied to separate the hydrogen atom bonded to the silicon atom of the silicon atomic layer 3. At this time, a silicon atom of the second silicon may be bonded to the silicon atom of the silicon atomic layer 3. Each of the silicon atomic layer 3 and the poly-silicon layer 7 may be formed by a chemical vapor deposition (CVD) process or a low-pressure CVD process. The silicon atomic layer 3 may be formed in advance within a process apparatus for forming the poly-silicon layer 7. At this time, a process recipe of the silicon atomic layer 3 may be the same as or similar to that of the poly-silicon layer 7. A process temperature of the silicon atomic layer 3 may be in a range of about 200° C. to about 600° C. In particular, the process temperature of the silicon atomic layer 3 may be in a range of about 200° C. to about 450° C. If the process temperature is lower than 200° C., a deposition rate of the silicon atomic layer 3 may be lowered to deteriorate a seed characteristic of the silicon atomic layer 3. If the process temperature is higher than 450° C., the first silicon precursor may be decomposed to deteriorate the seed characteristic of the silicon atomic layer 3.

During the formation of the poly-silicon layer 7, at least one of Group III elements, Group V elements, or carbon may be supplied to dope the poly-silicon layer 7.

Alternatively, referring to FIG. 2B, a silicon atomic layer 3 corresponding to the single-layered silicon atomic layer of FIG. 1A is formed on a substrate 1. Even though not illustrated in FIG. 2B, the oxide layer 5 of FIG. 1B may be additionally formed on the substrate 1. A non-silicon layer 9 corresponding to a single-layered atomic layer is formed on the silicon atomic layer 3. The non-silicon layer 9 may be formed by supplying a precursor including at least one element selected from a group consisting of oxygen, nitrogen, or germanium. The element may be bonded to the silicon of the silicon atomic layer 3. At this time, the hydrogen bonded to the silicon may be removed. The silicon atomic layer 3 and the non-silicon layer 9 may be alternately and repeatedly formed. Thus, a silicon-containing layer 11 may be formed. The silicon-containing layer 11 may be a silicon oxide layer, a silicon nitride layer, or a silicon-germanium layer. The silicon precursor of the inventive concepts may be used as a silicon source for forming the silicon-containing layer 11. The process of forming the silicon-containing layer 11 may be a plasma-enhanced CVD (PECVD) process or an atomic layer deposition (ALD) process. A process temperature of the PECVD process may be in a range of a room temperature to about 450° C. A process temperature of the ALD process may be in a range of about 100° C. to about 450° C. If the process temperature of the ALD process is lower than 100° C., a deposition rate of the silicon atomic layer 3 may be low. If the process temperature of the ALD process is higher than 450° C., the silicon precursor may be decomposed to deteriorate an ALD characteristic.

In still other embodiments, referring to FIG. 2C, a silicon atomic layer 3 corresponding to the single-layered silicon atomic layer of FIG. 1A is formed on a substrate 1. Even though not illustrated in FIG. 2C, the oxide layer 5 of FIG. 1B may be additionally formed on the substrate 1. A silicon-containing layer 13 is formed on the silicon atomic layer 3. The silicon-containing layer 13 may be a silicon oxide layer, a silicon nitride layer, or a silicon-germanium layer. Any silicon precursor may be used when the silicon-containing layer 13 is formed. A morphology or step coverage characteristic of the silicon-containing layer 13 may be improved by the existence of the silicon atomic layer 3. The silicon atomic layer 3 may function as a wetting layer.

FIRST EXPERIMENTAL EXAMPLE

Two samples were prepared in the present experimental example. A single-layered silicon atomic layer (or a seed layer) was formed using the silicon precursor of the inventive concepts on a bare wafer, and a poly-silicon layer was then deposited to prepare a sample according to the inventive concepts. A single-layered silicon atomic layer was formed using a silicon precursor of a comparison example on a bare wafer, and a poly-silicon was then deposited to prepare a sample according to the comparison example. A surface roughness of each of the deposited poly-silicon layers of the samples was measured. The surface roughness was measured according to a thickness of each of the deposited poly-silicon layers. Dialkylaminodisilane was used as the silicon precursor of the inventive concepts. Diisopropylaminosilane (($C_3H_7)_2N$—$SiH_3$) was used as the silicon precursor of the comparison example. Monosilane ($SiH_4$) was supplied when the poly-silicon layer of each sample was deposited. The surface roughness was obtained by a root mean square method.

Figure 3:
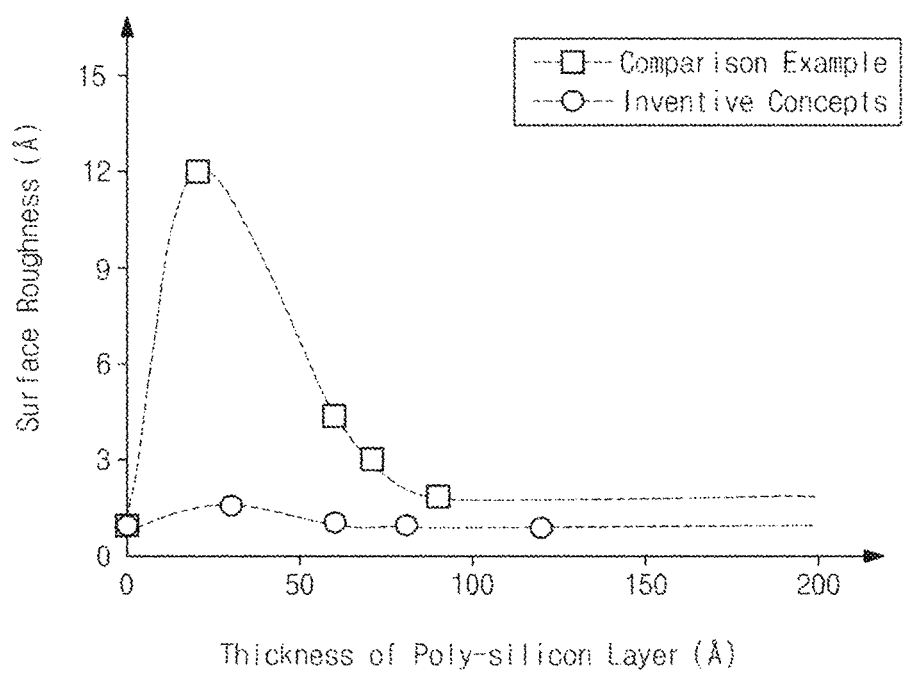
FIG. 3 is a graph illustrating the result of a first experimental example.

FIG. 3 is a graph illustrating the result of a first experimental example. Referring to FIG. 3, the surface roughness of the sample using the silicon precursor of the inventive concepts is smaller than that of the second sample using the silicon precursor of the comparison example in a substantially entire range of the thickness of the poly-silicon layer. In particular, the surface roughness of the sample of the inventive concepts is very smaller than that of the sample of the comparison example in the event that the thickness of the poly-silicon layer is equal to or smaller than about 100 Å (more particularly, 50 Å). The surface roughness (or surface morphology) of the sample of the inventive concepts is equal to or smaller than 2 Å. As a result, it is confirmed that the silicon precursors of the inventive concepts are uniformly adsorbed on a wafer during a seed deposition process to form the poly-silicon layer having excellent morphology.

SECOND EXPERIMENTAL EXAMPLE

Three samples were prepared in the present experimental example. A poly-silicon layer was directly deposited on a bare wafer to prepare a sample according to a first comparison example. In other words, a seed layer was not formed in the sample of the first comparison example. A seed layer was formed using a silicon precursor of a comparison example on a bare wafer, and a poly-silicon layer was then deposited to prepare a sample according to a second comparison example. A seed layer was formed using the silicon precursor of the inventive concepts on a bare wafer, and a poly-silicon was then deposited to prepare a sample according to the inventive concepts. A thickness of each poly-silicon layer according to a position was measured. Dialkylaminodisilane was used as the silicon precursor of the inventive concepts. Diisopropylaminosilane $((C_3H_7)_2N-SiH_3)$ was used as the silicon precursor of the second comparison example. Monosilane $(SiH_4)$ was supplied when the poly-silicon layers of each sample was deposited.

Figure 4:
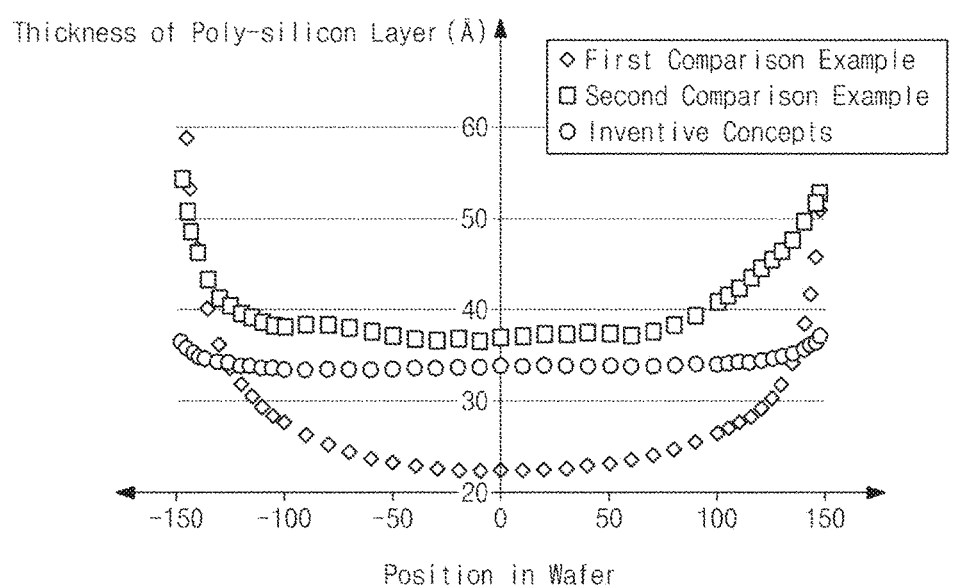
FIG. 4 is a graph illustrating the result of a second experimental example.

FIG. 4 is a graph illustrating the result of a second experimental example. Referring to FIG. 4, each of the wafers was loaded in a vertical furnace to deposit the poly-silicon layer. Since a reaction gas is supplied in the state the wafer is rotated in the vertical furnace, it may be relatively difficult to supply the reaction gas to a center of the wafer (e.g., a position of '0' in FIG. 4). Thus, a deposited layer may be thin on the center of the wafer and may become progressively thicker toward an edge of the wafer (e.g., positions of '150' and '450' in FIG. 4). The poly-silicon layer is entirely thin in the sample of the first comparison example not having the seed layer, so it difficult to use the poly-silicon layer of the first comparison example. In addition, a deviation of the thickness of the poly-silicon layer of the first comparison is large, and thus, a uniformity of the poly-silicon layer is poor. In the sample of the second comparison example, the poly-silicon layer is entirely thick but a uniformity of the poly-silicon according to a position is poor. In the sample of the inventive concepts, the poly-silicon layer has a sufficient thickness. In addition, the poly-silicon layer according to the inventive concepts has a substantially uniform thickness. As a result, the silicon precursors of the inventive concepts are uniformly adsorbed on the wafer during the seed deposition process, so the poly-silicon layer of the inventive concepts has an excellent uniformity.

Even though not illustrated in FIGS. 2A, 2B, and 2C, the substrate 1 may have a lower structure in which a recessed region is formed. The silicon atomic layer 3 may conformally cover the uneven lower structure, and the poly-silicon layer 7 or the silicon-containing layer 11 or 13 formed on the silicon atomic layer 3 may have improved uniformity and step coverage property. The recessed region may be a contact hole or an active hole for formation of an active pillar of a three-dimensional (3D) NAND flash memory device. In this case, an aspect ratio of the recessed region may be 10:1 or more. In the event that a layer is formed using the silicon precursor of the inventive concepts in the recessed region having the high aspect ratio, the layer may have the excellent step coverage property, uniformity and morphology. The silicon precursor of the inventive concepts increases the number of silicon-hydrogen bonds as compared with the monosilane. Thus, an incubation time may be improved, and a surface morphology property of the seed layer may be 1 Å or less. As a result, the silicon precursor according to the inventive concepts may overcome limitations of a process of forming a thin poly-silicon layer.

The method of forming the layer according to the inventive concepts may be applied to semiconductor fabricating processes such as, for example, a fabricating process of a dynamic random access memory (DRAM) device, a fabricating process of a 3D NAND flash memory device, and a double patterning process. The silicon precursor of the inventive concepts also has an excellent adsorption property on a hydrocarbon layer, and thus, the method of forming the layer according to the inventive concepts may be applied to a semiconductor fabricating process including a chemical mechanical polishing (CMP) process using an etch selectivity between the hydrocarbon layer and a silicon layer.

FIGS. 5 to 11 are perspective views illustrating a method of fabricating a semiconductor device according to some embodiments of the inventive concepts. A semiconductor device according to the present embodiment may be a DRAM device.

Figure 5:
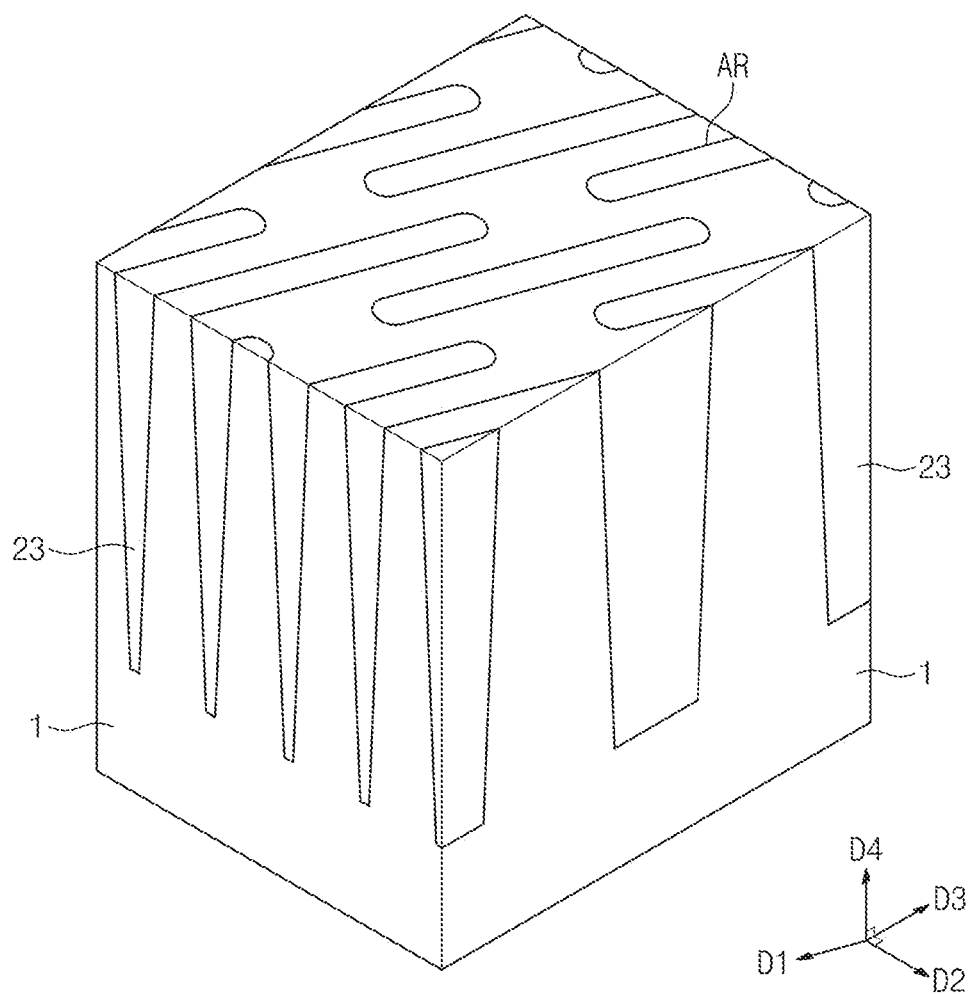
FIGS. 5 to 11 are perspective views illustrating a method of fabricating a semiconductor device according to some embodiments of the inventive concepts.

Referring to FIG. 5, a device isolation layer 23 may be formed in a substrate 1 to define active regions AR. The substrate 1 may be, for example, a silicon wafer substrate or a silicon-on-insulator (SOI) substrate. The device isolation layer 23 may be formed using, for example, a shallow trench isolation (STI) technique. The device isolation layer 23 may be formed of at least one of, for example, a silicon oxide layer, a silicon nitride layer, or a silicon oxynitride layer. Before the formation of the device isolation layer 23, trenches may be formed in the substrate 1 and then the silicon atomic layer 3 of FIG. 1A may be conformally formed using the silicon precursor of the inventive concepts on the substrate 1. The active regions AR may have bar-shapes extending in a first direction D1.

Figure 6:
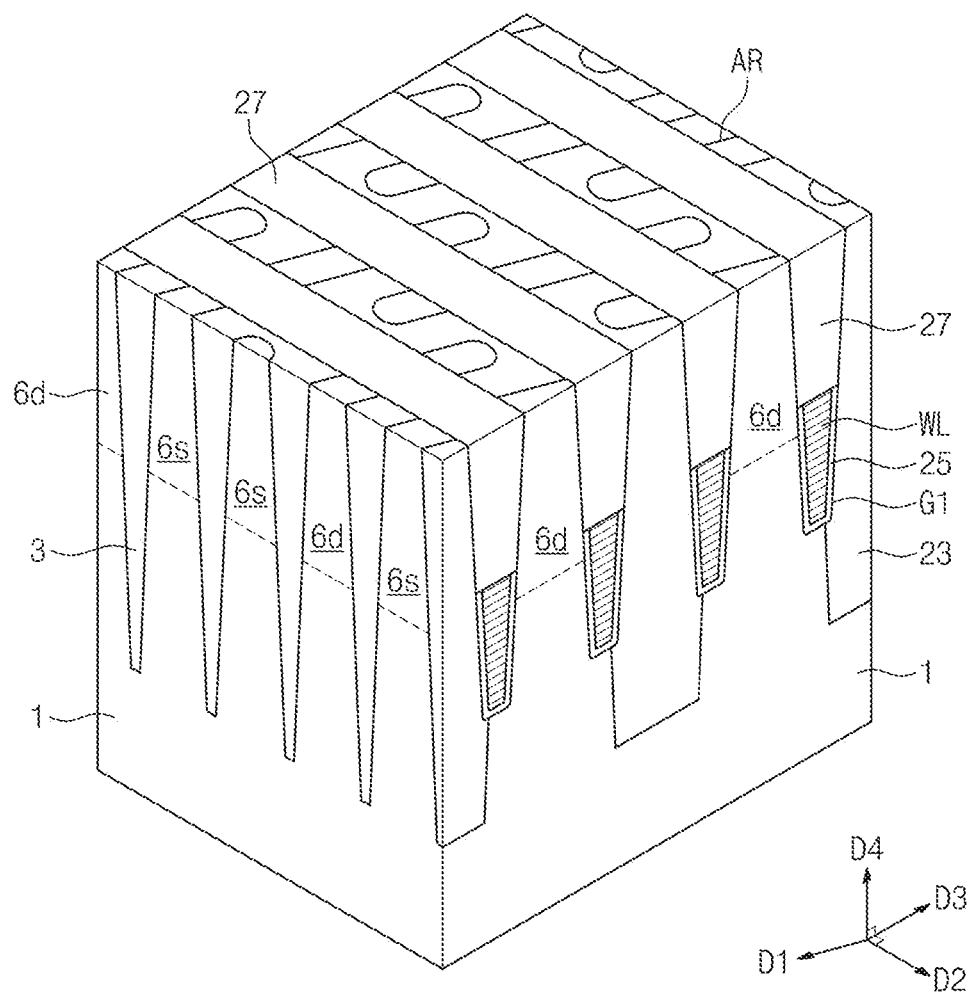

Referring to FIG. 6, first mask patterns (not shown) extending in a second direction D2 intersecting the first direction D1 may be formed on the substrate 1, and the device isolation layer 23 and the substrate 1 of the active regions AR may be then etched using the first mask patterns as an etch mask to form first grooves G1. The first mask patterns (not shown) may have linear shapes. At this time, an etch rate of the device isolation layer 23 may be higher than an etch rate of the substrate 1 by controlling an etch recipe. Thus, a bottom surface of the first groove G1 may be uneven. A gate insulating layer 25 may be formed on the substrate 1 exposed by the groove 1. The gate insulating layer 25 may be formed of, for example, a thermal oxide layer. A conductive layer may be formed in the first groove G1 having the gate insulating layer 25 and may be then recessed to form a word line WL. Subsequently, a first capping pattern 27 may be formed on the word line WL in the first groove G1. The first capping pattern 27 may be formed of, for example, a silicon nitride layer and/or a silicon oxynitride layer. The first mask patterns (not shown) may be removed, and an ion implantation process may be then performed to form first dopant injection regions 6s and second dopant injection regions 6d in the substrate 1 not covered with the first capping pattern 27. The first dopant injection regions 6s and the second dopant injection regions 6d may be doped with the dopants of the same conductivity type, e.g., N-type dopants. A depth of the first dopant injection region 6s may be different from that of the second dopant injection region 6d. A plurality of ion implantation processes may be performed to form the first and second dopant injection regions 6s and 6d having the depths different from each other.

Figure 7:
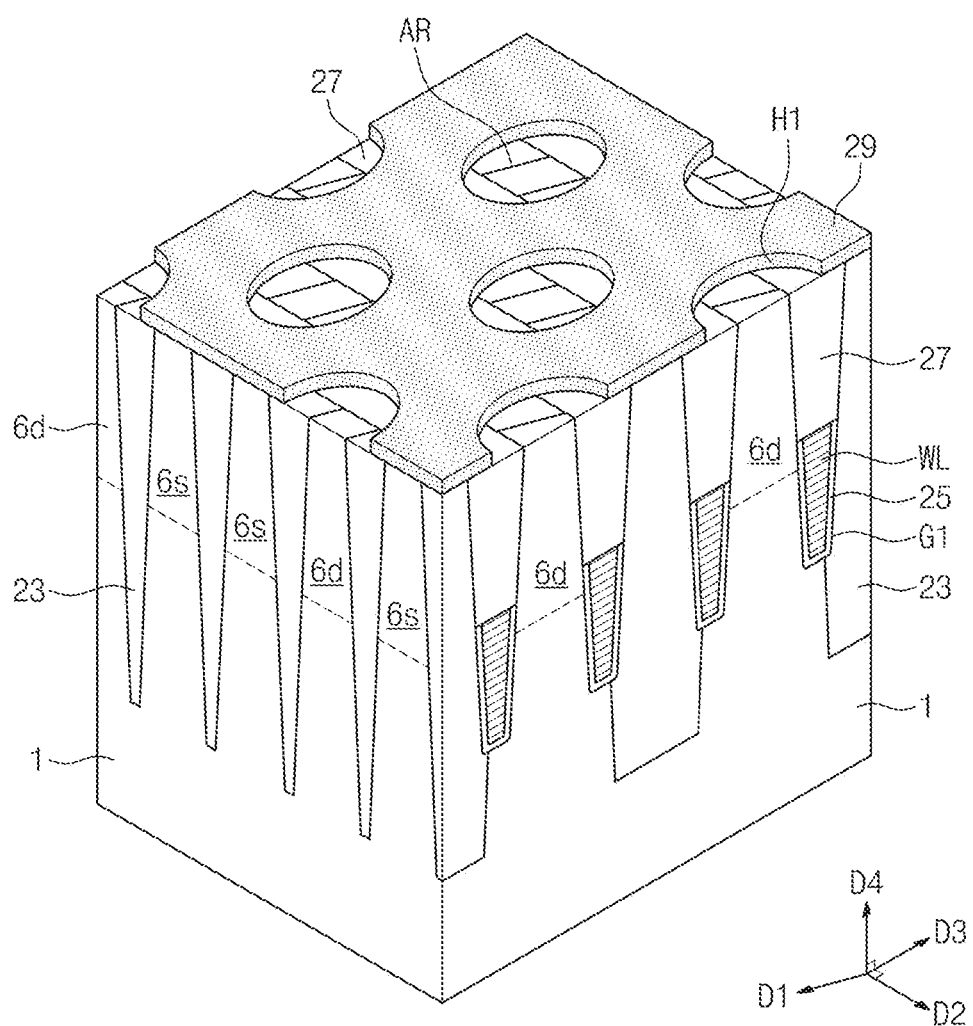

Referring to FIG. 7, a first insulating layer 29 may be formed on an entire surface of the substrate 1. The first insulating layer 29 may be formed of at least one of a silicon oxide layer, a silicon nitride layer, or a silicon oxynitride layer. A second mask pattern (not shown) may be formed on the first insulating layer 29, and the first insulating layer 29 may be patterned using the second mask pattern (not shown) as an etch mask to form openings H1 exposing the second dopant injection regions 6d. The opening H1 may have a width greater than that of the second dopant injection region 6d. Thus, the opening H1 may expose the device isolation layer 23 and the first capping pattern 27 that are adjacent to the second dopant injection region 6d.

Figure 8:
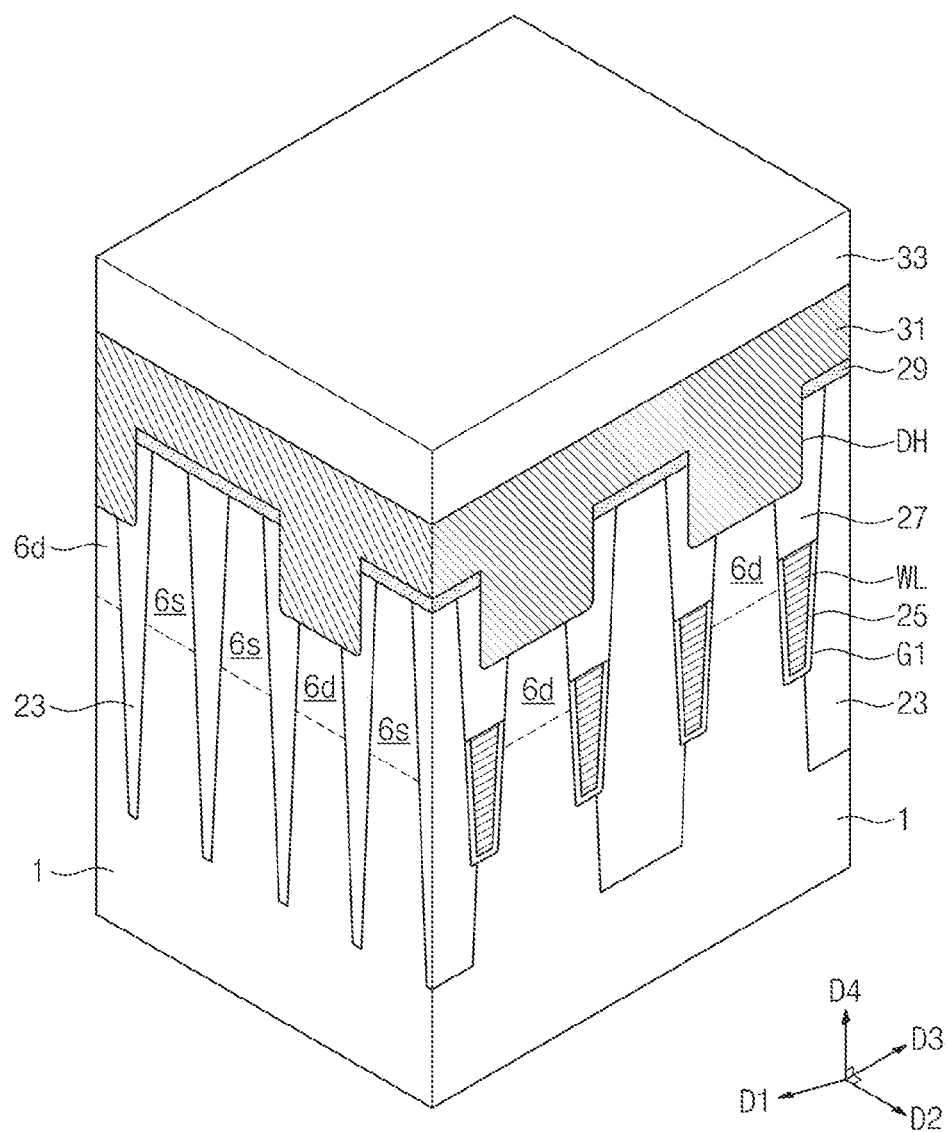

Referring to FIG. 8, the substrate 1, the device isolation layer 23, and the first capping pattern 27 which are exposed by the openings H1 may be etched using the second mask pattern (not shown) as an etch mask to form bit line node contact holes DH. A bottom surface of the bit line node contact hole DH is higher than a bottom surface of the second dopant injection region 6d and a bottom surface of the first capping pattern 27. The second mask pattern (not shown) is removed after the formation of the bit line node contact hole DH. Thereafter, a conductive layer 31 and a second capping layer 33 may be sequentially formed on the first insulating layer 29. The conductive layer 31 may fill the bit line node contact holes DH.

Figure 9:
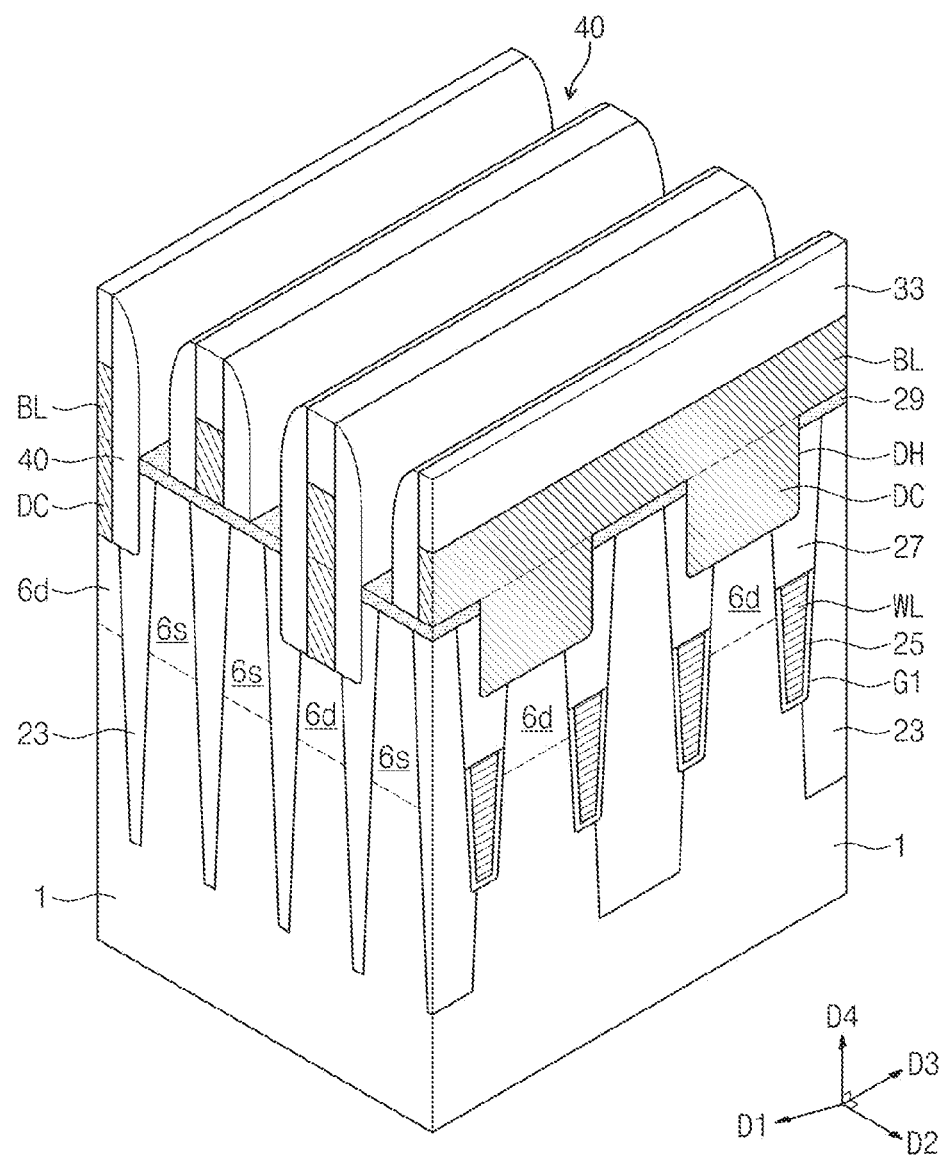

Referring to FIG. 9, the second capping layer 33 and the conductive layer 31 may be successively patterned to form a plurality of second capping patterns 33 having linear shapes, bit lines BL under the second capping patterns 33, and bit line node contacts DC (or bit line node contact plugs DC) in the bit line node contact holes DH. Spacers 40 may be formed to cover sidewalls of the second capping patterns 33, sidewalls of the bit lines BL, and sidewalls of the bit line node contacts DC. The bit line BL may extend in a third direction D3 intersecting the first and second directions D1 and D2.

Figure 10:
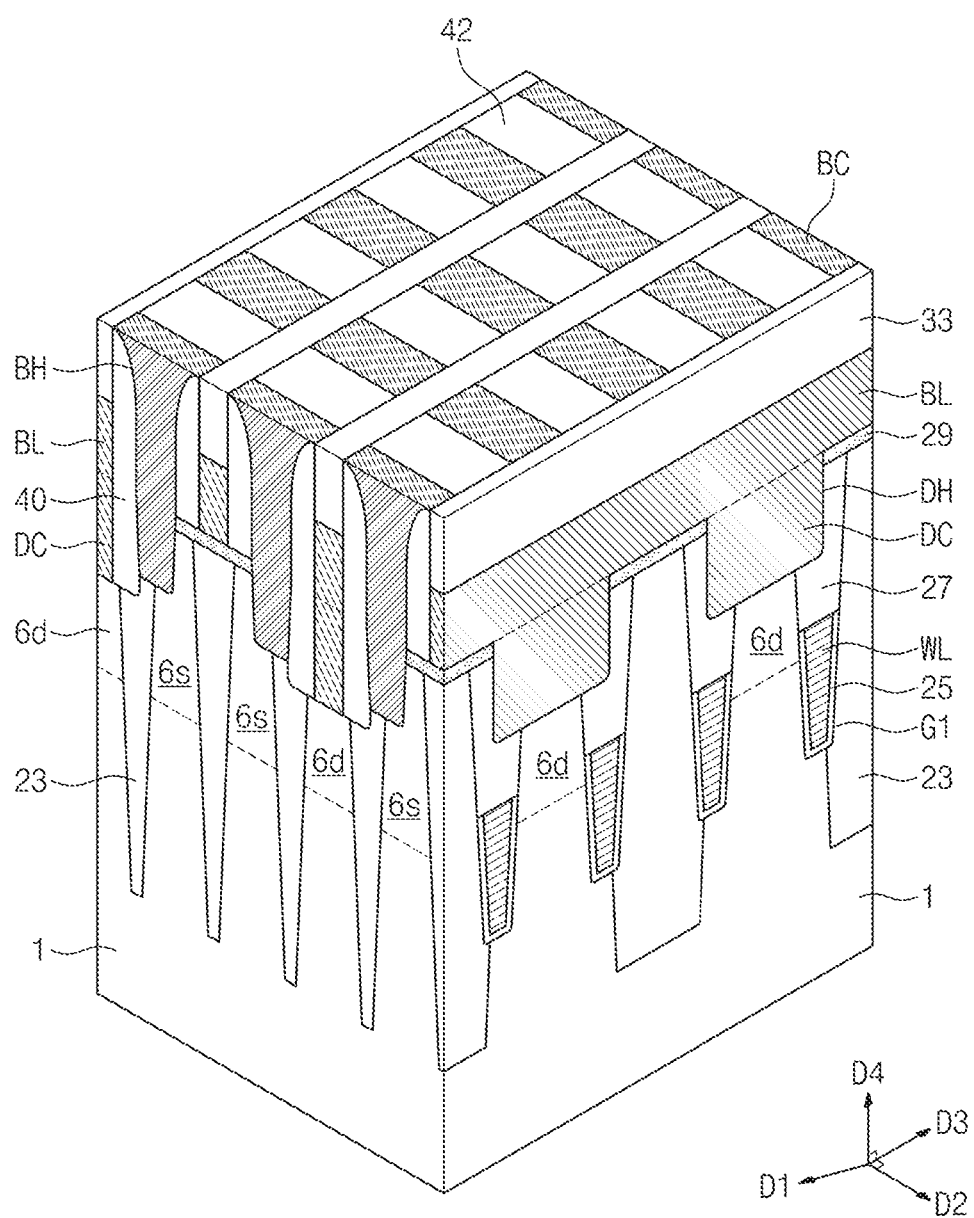

Referring to FIG. 10, spaces between the bit lines BL may be filled with a second insulating layer 42. Portions of the second insulating layer 42, the first insulating layer 29, the substrate 1, and the device isolation layer 23 may be removed to form storage node contact holes BH. A conductive layer may be formed to fill the storage node contact holes BH, and a planarization process may be then performed on the conductive layer to form storage node contacts BC (or storage node contact plugs BC).

Figure 11:
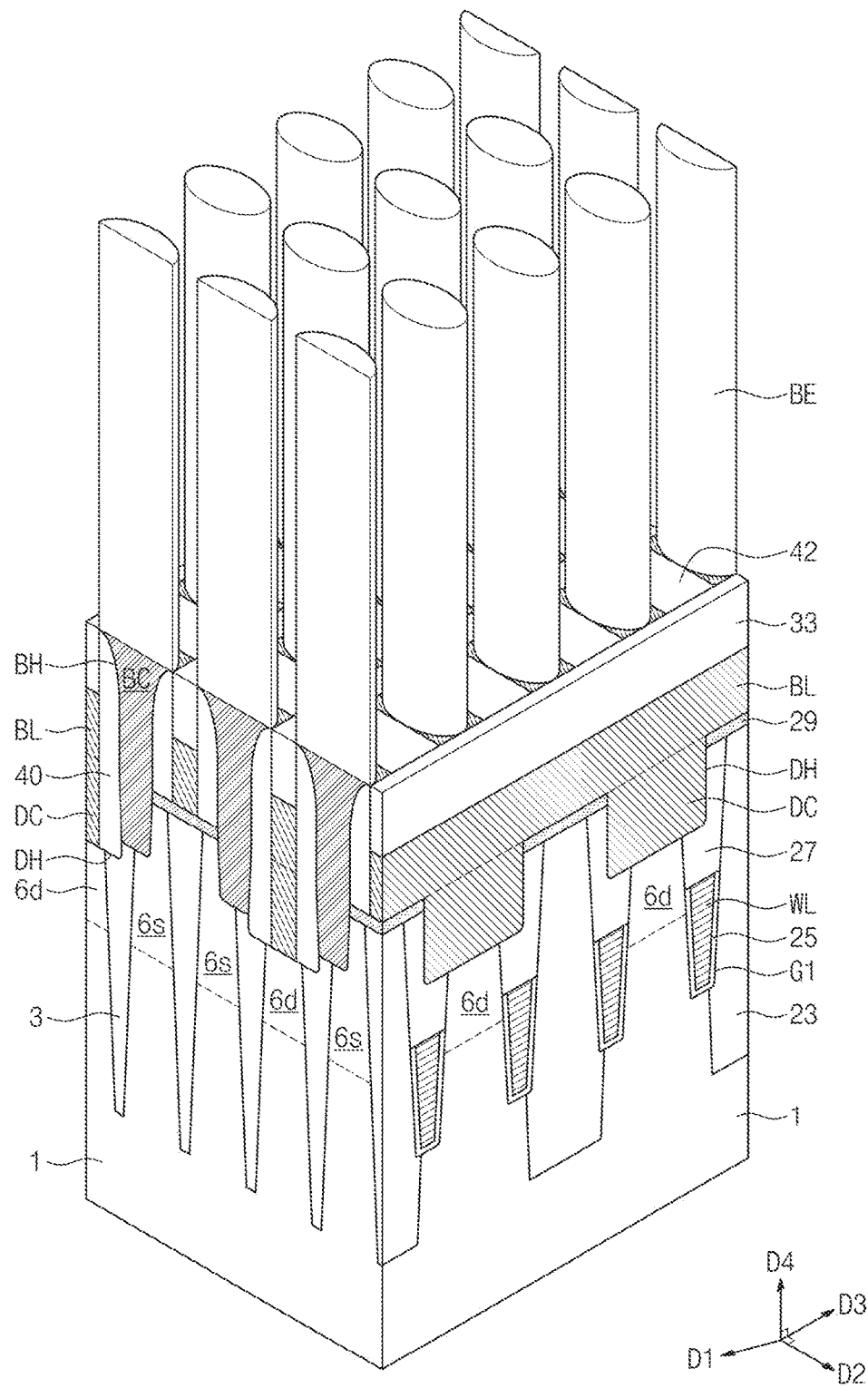

Referring to FIG. 11, lower electrodes BE may be formed to be connected to the storage node contacts BC. Even though not illustrated in the drawings, a dielectric layer and an upper electrode may be formed on the lower electrodes BE.

In the present embodiment, the device isolation layer 23, the insulating layers 25, 29, and 42, and the capping layers 27 and 33 may be formed of a silicon oxide layer and/or a silicon nitride layer, and the silicon precursor of the inventive concepts may be used as silicon sources for the formation of the layers 23, 25, 29, 42, 27 and 33. In the present embodiment, the storage node contact BC, the bit line node contact DC, the word line WL, and/or the bit line BL may be formed of a poly-silicon layer doped with dopants. In this case, a silicon seed layer may be formed using the silicon precursor of the inventive concept for the formation of the poly-silicon layers of the storage node contact BC, the bit line node contact DC, the word line WL, and/or the bit line BL. In particular, since the DRAM device according to the present embodiment includes a buried word line, the trench for the formation of the device isolation layer 23 and/or the groove for the formation of the word line WL may have a high aspect ratio. In addition, the storage node contact hole BH may have a high aspect ratio. Generally, it may be difficult to fill a recessed region having a high aspect ratio with a material layer without a void. However, this difficulty may be solved by the silicon precursor of the inventive concepts.

Figure 12:
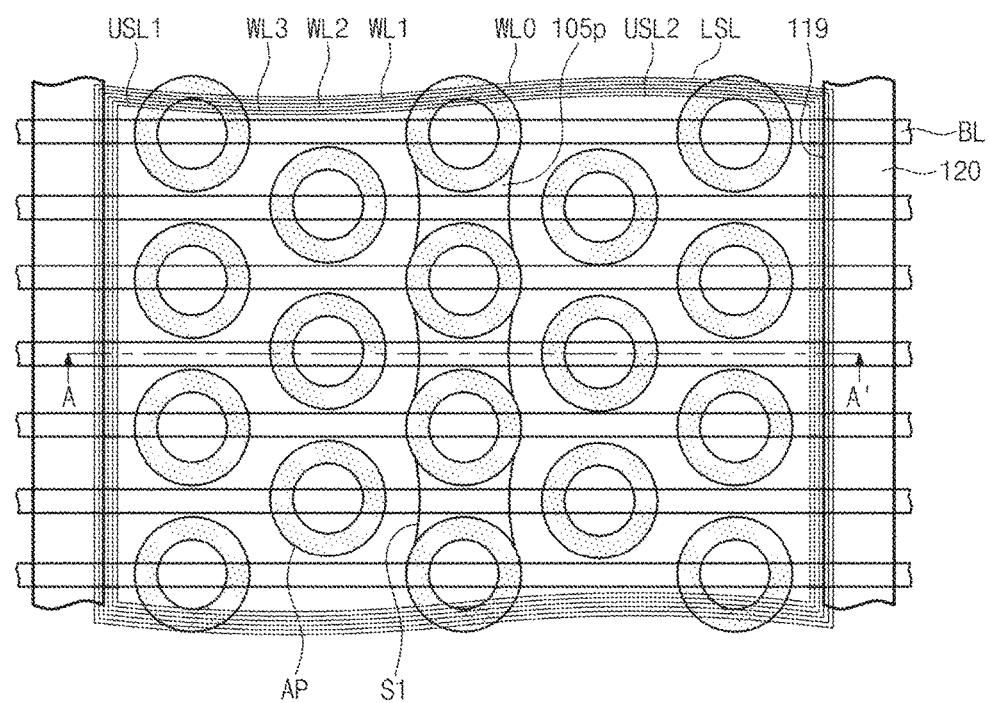
FIG. 12 is a plan view illustrating a semiconductor device according to other embodiments of the inventive concepts.

FIG. 12 is a plan view illustrating a semiconductor device according to other embodiments of the inventive concepts. FIGS. 13 to 17 are cross-sectional views taken along a line A-A' of FIG. 12 to illustrate a method of fabricating the semiconductor device of FIG. 12. A semiconductor device according to the present embodiment may be a vertical NAND-flash memory device.

Figure 13:
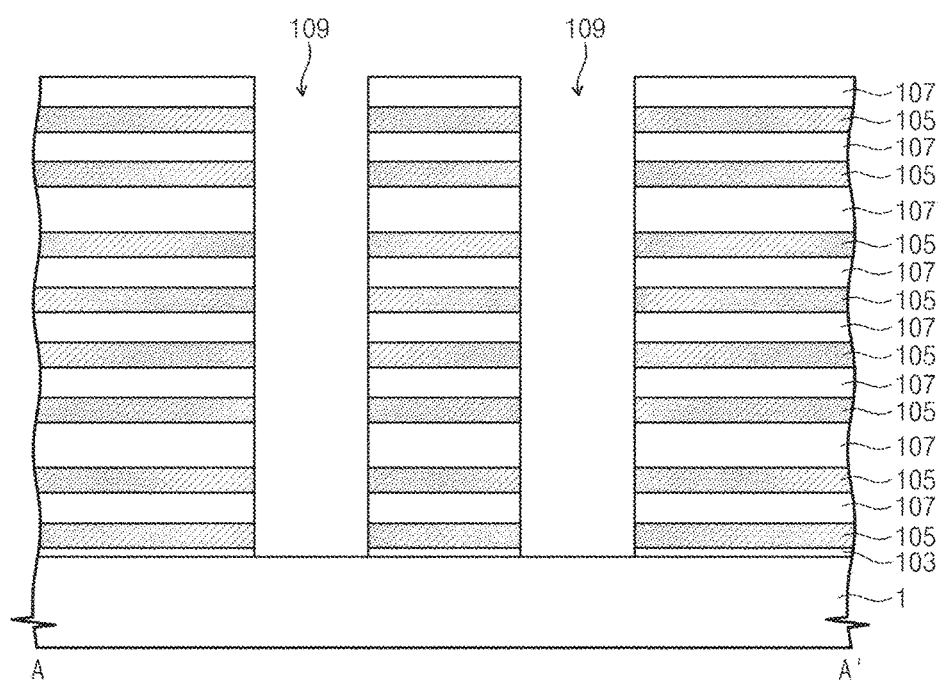
FIGS. 13 to 17 are cross-sectional views taken along a line A-A' of FIG. 12 to illustrate a method of fabricating the semiconductor device of FIG. 12.

Referring to FIGS. 12 and 13, a buffer oxide layer 103 may be formed on a substrate 1. Sacrificial layers 105 and inter-gate insulating layers 107 may be alternately and repeatedly formed (or stacked) on the buffer oxide layer 103. The sacrificial layers 105 may be formed of a material having an etch rate different from that of the inter-gate insulating layers 107. For example, each of the sacrificial layers 105 may be formed of a silicon nitride layer, and each of the inter-gate insulating layers 107 may be formed of a silicon oxide layer. The inter-gate insulating layers 107, the sacrificial layers 105, and the buffer oxide layer 103 may be successively patterned to form active holes 109 exposing the substrate 1. An aspect ratio of the active hole 109 may be 10:1 or more.

Figure 14:
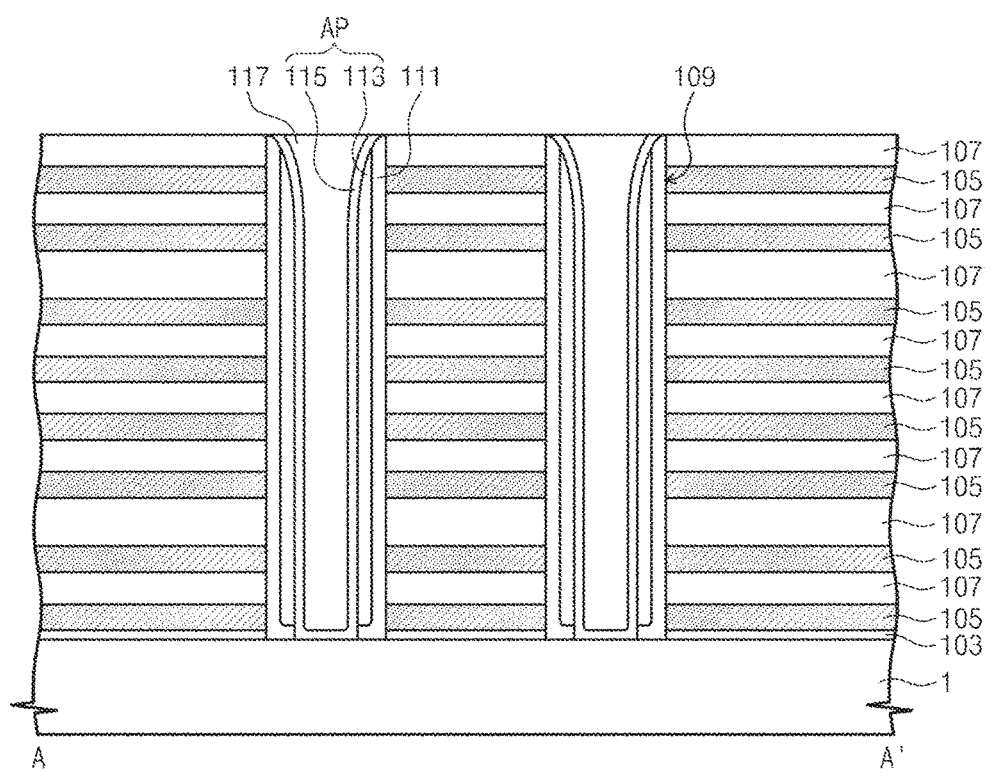

Referring to FIGS. 12 and 14, a gate insulating layer 111 and a first active layer 113 may be sequentially on an entire surface of the substrate 1 having the active holes 109. The gate insulating layer 111 and the first active layer 113 may be conformally formed in the active holes 109. The gate insulating layer 111 may include at least a tunnel insulating layer and a data storage layer. The tunnel insulating layer may be formed of a silicon oxide layer, and the data storage layer may be formed of a silicon nitride layer. The gate insulating layer 111 may be formed using the method of forming the layer according to embodiments of the inventive concepts. Since silicon precursor of the inventive concepts has the adsorption property that is substantially uniform on all of the substrate 1 formed of silicon, the sacrificial layer 105 formed of a silicon nitride layer and the inter-gate insulating layer 107 formed of a silicon oxide layer, the gate insulating layer 111 may have excellent step coverage property, morphology and uniformity. The gate insulating layer 111 and the first active layer 113 may be anisotropically etched to form a gate insulating layer 111 and a first active layer 113 having spacer-shapes and to expose the substrate 1 of a bottom surface of the active hole 109. The first active layer 113 may be formed of a poly-silicon layer. In this case, step coverage, morphology and uniformity properties of the first active layer 113 are very important. If these properties of the first active layer 113 are poor, a portion of the gate insulating layer 111 may be exposed and damaged during the anisotropic etching process. Thus, operating errors of a device may occur. However, the first active layer 113 is formed using the method of forming the layer according to embodiments of the inventive concepts, so these properties of the first active layer 113 are excellent. Thus, the problems such as the operating errors may be prevented. Subsequently, a second active layer 115 may be conformally formed, and a first filling insulation layer 117 may be formed to fill the active hole 109. The second active layer 115 may be formed of a poly-silicon layer using the method of forming the layer according to embodiments of the inventive concepts. Thereafter, a planarization process may be performed to form an active pillar AP. The active pillar AP includes the first active layer 113 having the spacer-shape and the second active layer 115 planarized by the planarization process. The gate insulating layer 113, the active pillar AP, and the first filling insulation layer 117 may remain in the active hole 109 after the planarization process is performed. The first filling insulation layer 117 may be formed of a silicon oxide layer.

Figure 15:
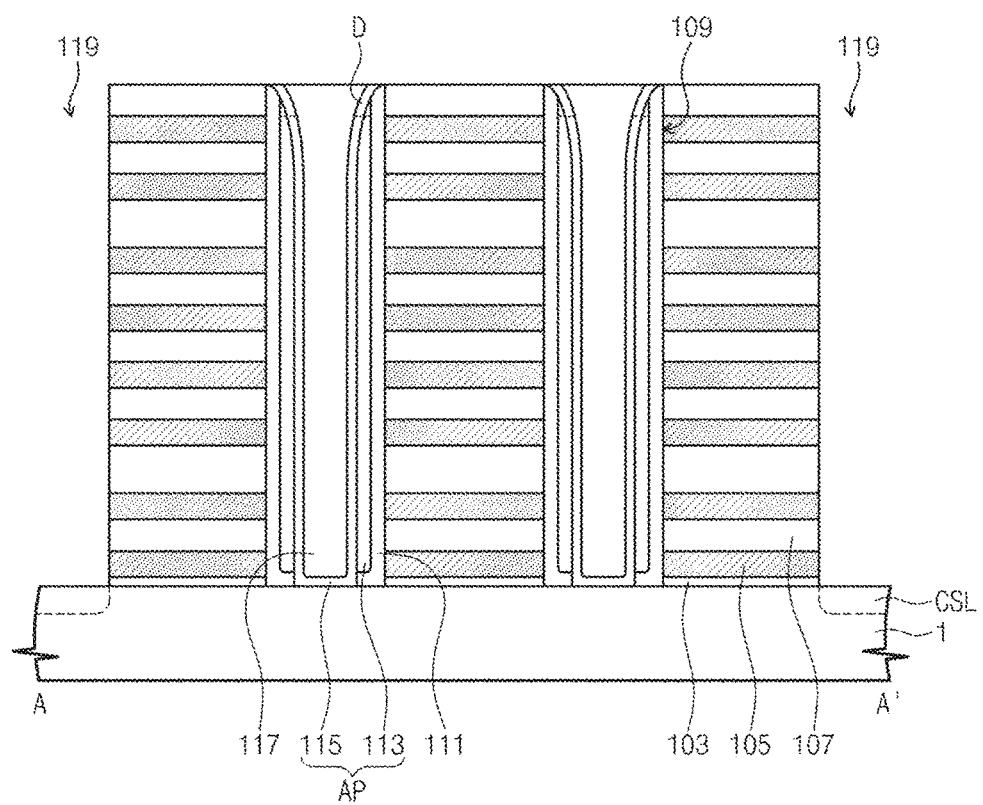

Referring to FIGS. 12 and 15, the inter-gate insulating layers 107, the sacrificial layers 105 and the buffer oxide layer 103 may be successively patterned to grooves 119 exposing the substrate 1. The grooves 119 are spaced apart from the active holes 109. An ion implantation process may be performed to form common source lines CSL in the substrate 1 exposed by the grooves 119, and a drain region D may be formed in a top end portion of the active pillar AP.

Figure 16:
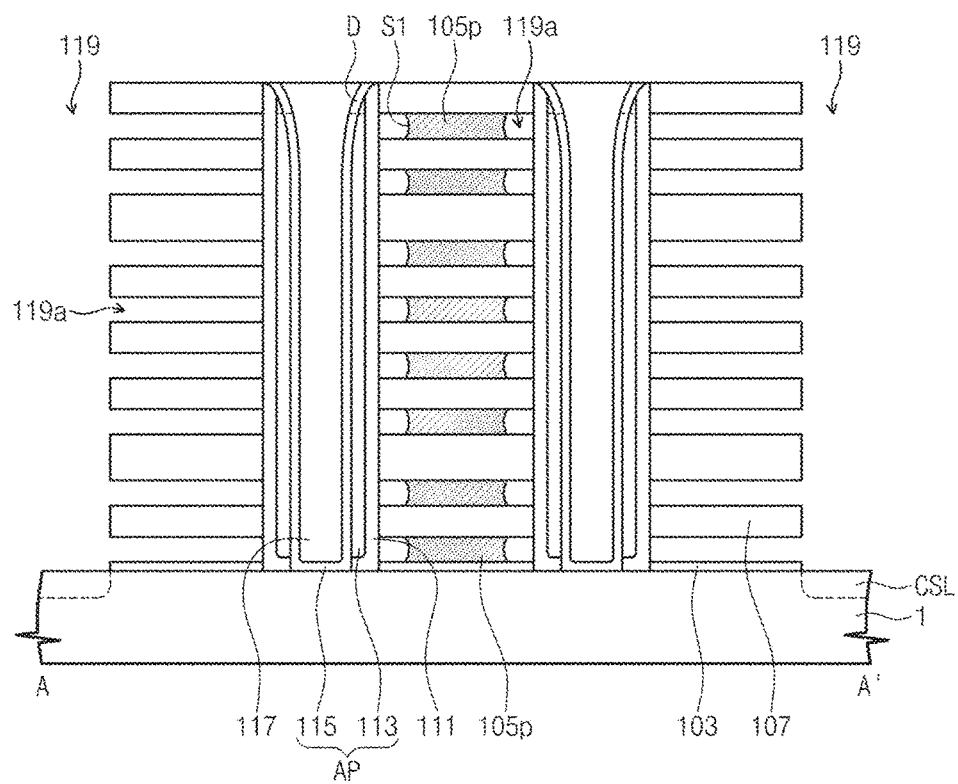

Referring to FIGS. 12 and 16, an isotropic etching process may be performed to partially remove the sacrificial layers 105 through the grooves 119. During the isotropic etching process, an etchant may be provided to sidewall portions of the sacrificial layers 105 exposed by the grooves 119. At this time, a process time of the isotropic etching process may be controlled to the isotropic etching process before entire portions of the sacrificial layers 105 are removed. Thus, portions of the sacrificial layers 105, which are far away from the groove 119, may not be removed, so sacrificial patterns 105p may remain. The sacrificial patterns 105p may be formed in a center region of a region between the grooves 119 adjacent to each other. In addition, sidewalls of the sacrificial patterns 105p may concavely formed by the isotropic etching process. This is because the etchant may more easily approach a central portion of the sidewall of the sacrificial pattern 105p than edge portions (i.e., top and bottom portions) of the sidewall of the sacrificial pattern 105p. Thus, the central portion of the sidewall of the sacrificial pattern 105p may be more etched. By the isotropic etching process, the sacrificial layers 105 may be partially etched to form empty spaces 119a.

Figure 17:
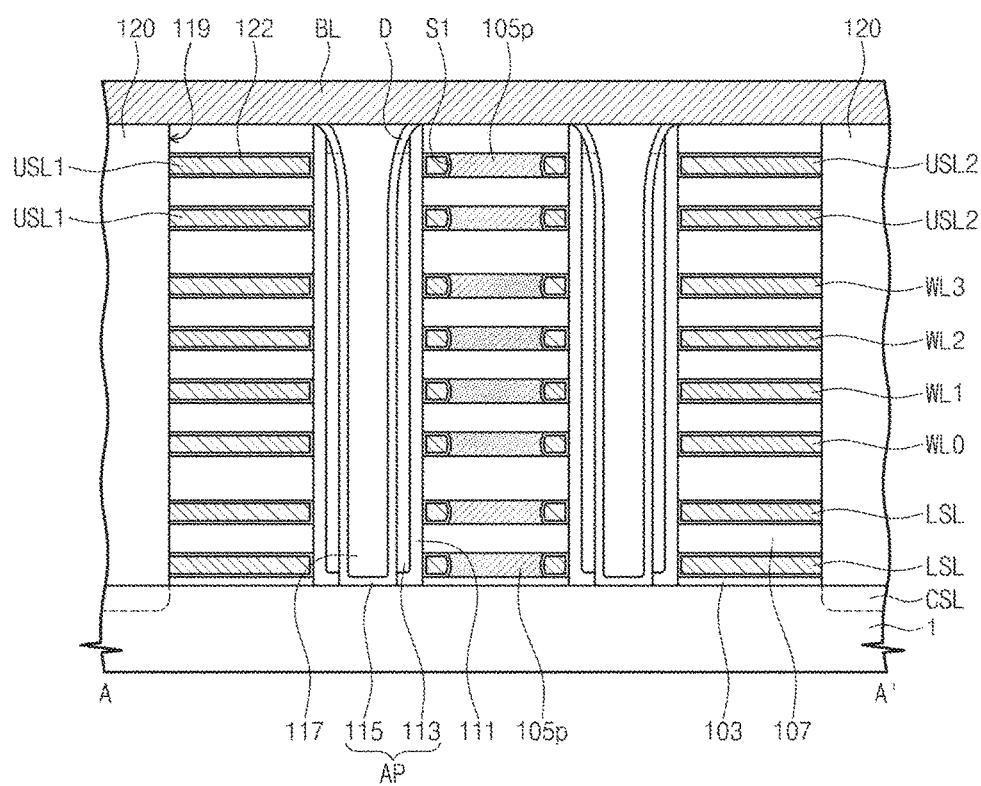

Referring to FIGS. 12 and 17, a high-k dielectric layer 122 may be conformally formed on the substrate 1. Subsequently, a conductive layer may be formed to fill the empty spaces 119a. At this time, the conductive layer may also be formed in the trenches 119. The conductive layer in the trenches 119 may be removed to form lower selection lines LSL, word lines WL, and upper selection lines USL. Thereafter, second filling insulation patterns 120 may be formed in the grooves 119. Subsequently, bit lines BL may be formed to be connected to the drain regions D.

Figure 18:
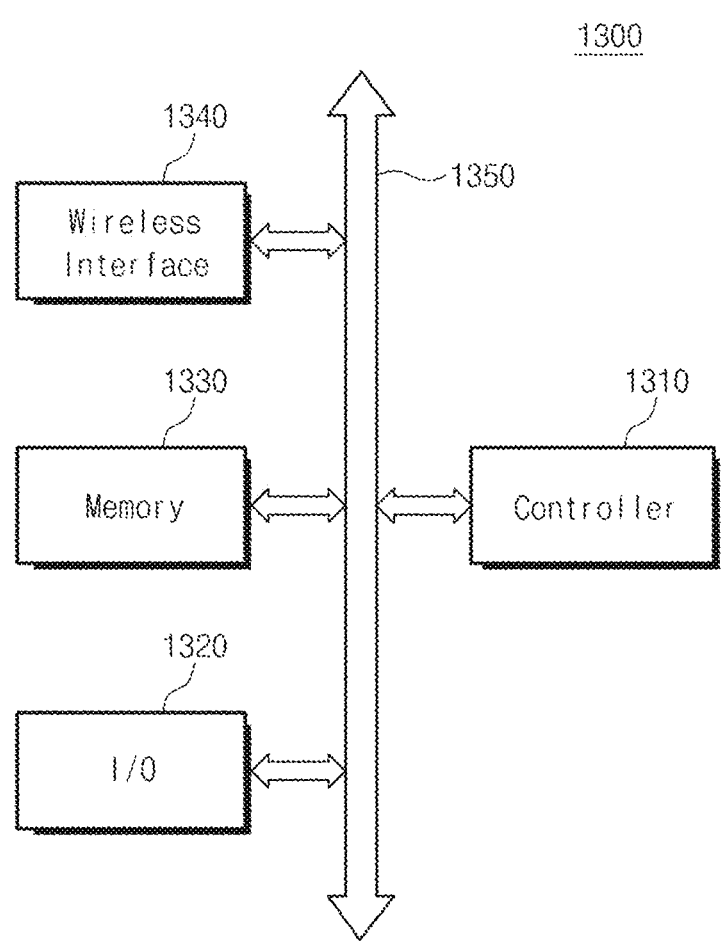
FIG. 18 is a schematic block diagram illustrating an electronic device including a semiconductor device according to embodiments of the inventive concepts.

FIG. 18 is a schematic block diagram illustrating an electronic device including a semiconductor device according to embodiments of the inventive concepts.

Referring to FIG. 18, an electronic device 1300 according to embodiments of the inventive concepts may be a personal digital assistant (PDA), a laptop computer, a portable computer, a web tablet, a wireless phone, a mobile phone, a digital music player, a cable/wireless electronic device, or a complex electronic device including at least two thereof. The electronic device 1300 may include a controller 1310, an input/output (I/O) unit 1320 (e.g., a keypad, a keyboard, and/or a display), a memory device 1330 and a wireless interface unit 1340 that communicate with each other through a data bus 1350. For example, the controller 1310 may include at least one of a microprocessor, a digital signal processor, a microcontroller, or other logic devices having a similar function to any one thereof. The memory device 1330 may store data and/or commands executed by the controller 1310. The memory device 1330 may include at least one of semiconductor devices according to embodiments of the inventive concepts. The electronic device 1300 may use the wireless interface unit 1340 to transmit electrical data to a wireless communication network communicating with a radio frequency (RF) signal or to receive electrical data from a communication network. For example, the wireless interface unit 1340 may include an antenna or a wireless transceiver. The electronic device 1300 may be used in a communication interface protocol such as a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Figure 19:
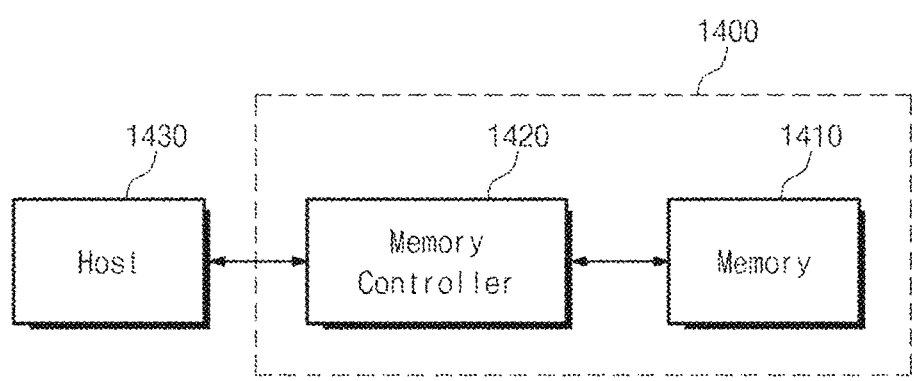
FIG. 19 is a schematic block diagram illustrating a memory system including a semiconductor device according to embodiments of the inventive concepts.

FIG. 19 is a schematic block diagram illustrating a memory system including a semiconductor device according to embodiments of the inventive concepts.

Referring to FIG. 19, the semiconductor devices according to embodiments of the inventive concepts may be used to realize a memory system. A memory card 1400 may include a memory device 1410 and a memory controller 1420 that store massive data. The memory controller 1420 may read data from/store data into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include at least one of the semiconductor devices according to the above embodiments of the inventive concepts.

According to some embodiments of the inventive concepts, the silicon precursor includes a silane group including two or more silicon atoms. The silicon precursor has a high and uniform adsorption property on surfaces of layers (e.g., a silicon layer, an oxide layer, and a nitride layer) that are mainly used when semiconductor devices are fabricated. Thus, the layer having an excellent seed property may be provided. In addition, the silicon precursor of the inventive concepts increases the number of silicon-hydrogen bonds as compared with the monosilane. Thus, an incubation time may be improved, and a surface morphology property of the seed layer may be 1 Å or less. As a result, the silicon precursor according to the inventive concepts may overcome limitations of a process of forming a thin poly-silicon layer.

According to other embodiments of the inventive concepts, the layer may be formed using the silicon precursor, so the step coverage property of the layer may be improved.

According to still embodiments of the inventive concepts, the semiconductor device may be fabricated using the silicon precursor, and thus, it is possible to prevent a void from being formed in the contact hole or the active hole. As a result, reliability of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A method of forming a layer, the method comprising:
providing a first precursor having a chemical formula of $R^1$—$Si_xH_y$ on a substrate to form a single-layered silicon atomic layer, wherein x is an integral number equal to 2 or 3, and y satisfies an equation having a formula of $y=2x+1$, and wherein $Si_xH_y$ of the first precursor is separated from $R^1$ to form the single-layered silicon atomic layer; and
providing a second precursor different from the first precursor on the single-layered silicon atomic layer to form a silicon-containing layer,
wherein $R^1$ has the following chemical formula 1,

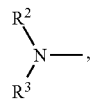

[chemical formula 1]

wherein each of $R^2$ and $R^3$ independently includes at least one of a methyl group, an ethyl group, a propyl group, an isopropyl group, a butyl group, or a tert-butyl group,
wherein providing the first precursor having the chemical formula of $R^1$—$Si_xH_y$ on the substrate is carried out at a temperature of between about 200° C. and about 450° C.,
wherein an oxide layer is provided on the substrate, and
wherein silicon atoms of $Si_xH_y$ of the first precursor are bonded to oxygen atoms that are bonded to the oxide layer after $Si_xH_y$ is separated from $R^1$.

2. The method of claim 1, wherein forming the silicon-containing layer comprises forming a silicon nitride layer, a silicon oxide layer, or a silicon-germanium layer.

3. The method of claim 1, wherein the second precursor comprises at least one of monosilane ($SiH_4$), disilane ($Si_2H_6$), or a high-grade silane having a chemical formula of $Si_nH_{2n+2}$, n being an integral number equal to or greater than 3,
wherein forming the silicon-containing layer comprises forming a poly-silicon layer using the single-layered silicon atomic layer as a seed layer, and
wherein the poly-silicon layer is formed by performing a chemical vapor deposition process.

4. The method of claim 3, wherein forming the silicon-containing layer further comprises:
doping the poly-silicon layer by providing at least one of Group III elements, Group V elements, or carbon.

5. The method of claim 1, wherein forming the silicon-containing layer comprises:
forming a non-silicon atomic layer on the single-layered silicon atomic layer,
wherein forming the single-layered silicon atomic layer and forming the non-silicon atomic layer are alternately and repeatedly performed, and
wherein the non-silicon atomic layer is formed by providing the second precursor containing at least one element selected from a group consisting of oxygen, nitrogen, or germanium.

6. The method of claim 1, wherein the first precursor is diisopropylaminodisilane ((($CH_3$)$_2$CH)$_2$N—$SiH_2SiH_3$).

7. A method of forming a layer, the method comprising:
providing a first precursor having a chemical formula of $R^1$—$Si_xH_y$ on a substrate to form a single-layered silicon atomic layer, wherein x is an integral number equal to 2 or 3, y satisfies an equation having a formula of y=2x+1, and $R^1$ includes at least one of an amino group, an alkyl group, a cyclopentadienyl ($C_5H_5$) group, or a halogen, and wherein $Si_xH_y$ of the first precursor is separated from $R^1$ to form the single-layered silicon atomic layer; and
forming a poly-silicon layer using the single-layered silicon atomic layer as a seed layer by providing a second precursor on the single-layered silicon atomic layer, the second precursor being different from the first precursor,
wherein providing the first precursor having the chemical formula of $R^1$—$Si_xH_y$ on the substrate is carried out at a temperature of between about 200° C. and about 450° C.,
wherein an oxide layer is provided on the substrate, and
wherein silicon atoms of $Si_xH_y$ of the first precursor are bonded to oxygen atoms that are bonded to the oxide layer after $Si_xH_y$ is separated from $R^1$.

8. The method of claim 7, wherein $R^1$ has the following chemical formula 1,

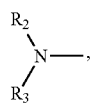

[chemical formula 1]

wherein each of $R^2$ and $R^3$ independently includes at least one of a methyl group, an ethyl group, a propyl group, an isopropyl group, or a butyl group.

9. The method of claim 7, wherein the second precursor comprises at least one of monosilane ($SiH_4$), disilane ($Si_2H_6$), or a high-grade silane having a chemical formula of $Si_nH_{2n+2}$, and
wherein n is an integral number equal to or greater than 3.

10. The method of claim 7, wherein the single-layered silicon atomic layer is formed to provide silicon adsorption sites so that silicon atoms of the second precursor are bonded to the silicon adsorption sites.

11. The method of claim 7, wherein forming the poly-silicon layer comprises performing a chemical vapor deposition process.

12. A method of forming a poly-silicon layer, the method comprising:
forming a single-layered silicon atomic layer on an underlying structure by providing diisopropylaminodisilane (DIPADS, (($CH_3$)$_2$CH)$_2$N—$SiH_2SiH_3$) on the underlying structure, wherein, during forming the single-layered silicon atomic layer, $SiH_2SiH_3$ of DIPADS is separated from ($CH_3$)$_2$CH)$_2$N, and silicon atoms of $SiH_2SiH_3$ are bonded to a surface of the underlying structure, and wherein providing the DIPADS is carried out at a temperature of between about 200° C. and about 450° C.; and
forming the poly-silicon layer using the single-layered silicon atomic layer as a seed layer by providing a precursor on the single-layered silicon atomic layer, wherein the precursor comprises monosilane ($SiH_4$), disilane ($Si_2H_6$), or a high-grade silane having a chemical formula of $Si_nH_{2n+2}$, n being an integral number equal to or greater than 3, and wherein the poly-silicon layer is formed by performing a chemical vapor deposition process,
wherein the underlying structure comprises a silicon substrate and an oxide layer on the silicon substrate, and
wherein the silicon atoms of $SiH_2SiH_3$ are bonded to oxygen atoms that are bonded to a surface of the oxide layer.

13. The method of claim 12, wherein the silicon atoms of $SiH_2SiH_3$ bonded to the oxygen atoms are silicon adsorption sites, and silicon atoms of the precursor are bonded to the silicon adsorption sites.

* * * * *